United States Patent [19]

Lewis et al.

[11] 4,371,739
[45] Feb. 1, 1983

[54] TERMINAL ASSEMBLY FOR SOLAR PANELS

[75] Inventors: Kathy Lewis, Canoga Park; James E. Avery, Burbank, both of Calif.

[73] Assignee: Atlantic Richfield Company, Los Angeles, Calif.

[21] Appl. No.: 311,816

[22] Filed: Oct. 16, 1981

[51] Int. Cl.³ .......................................... H01L 31/04
[52] U.S. Cl. .................................. 136/251; 136/244; 136/259
[58] Field of Search ...................... 136/244, 251, 259

[56] References Cited

U.S. PATENT DOCUMENTS

| | | | |
|---|---|---|---|
| 3,982,963 | 9/1976 | Mahoney et al. | 136/251 |
| 4,097,308 | 6/1978 | Klein et al. | 136/251 |
| 4,239,555 | 12/1980 | Scharlack et al. | 136/251 |

FOREIGN PATENT DOCUMENTS

| | | | |
|---|---|---|---|
| 2757765 | 2/1979 | Fed. Rep. of Germany | 136/251 |
| 1023847 | 3/1966 | United Kingdom | 136/251 |

OTHER PUBLICATIONS

H. Somberg, "Automated Solar Panel Assembly Line", Quarterly Report No. 1, JPL Contract 955278, Apr. 1979, DOE/JPL/955278-1.

C. R. Witham, "Process Development for Automated Solar Cell & Module Production", DOE/JPL/9548-82-15 (Jun. 1979).

Primary Examiner—Aaron Weisstuch
Attorney, Agent, or Firm—Nilsson, Robbins, Dalgarn, Berliner, Carson & Wurst

[57] ABSTRACT

A terminal assembly for providing external electrical connection to a solar panel having at least one solar cell and an electrically conductive layer located behind the cell. The terminal assembly has a substantially flat conductive portion between the cell and the conductive layer, and an insulating member of high dielectric strength positioned behind the flat portion to electrically isolate the flat portion from the conductive layer. A connector portion preferably extends rearwardly from the flat portion and through an opening in the conductive layer, the insulating member extending about the connector portion.

27 Claims, 9 Drawing Figures

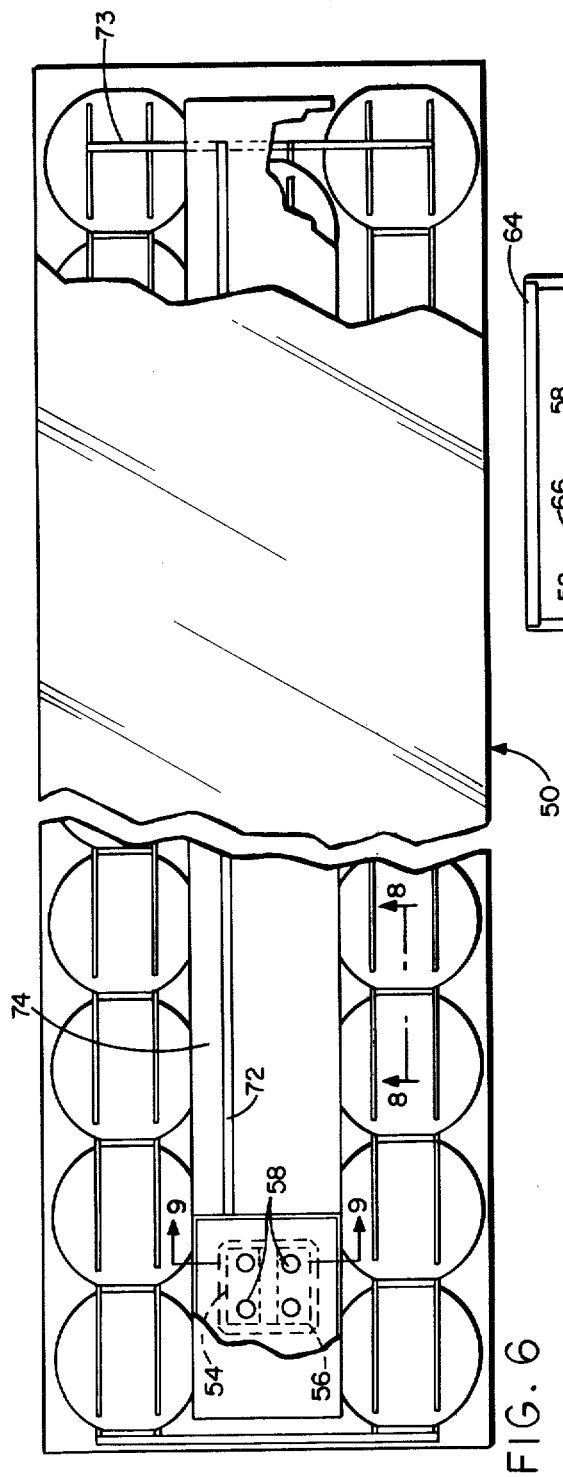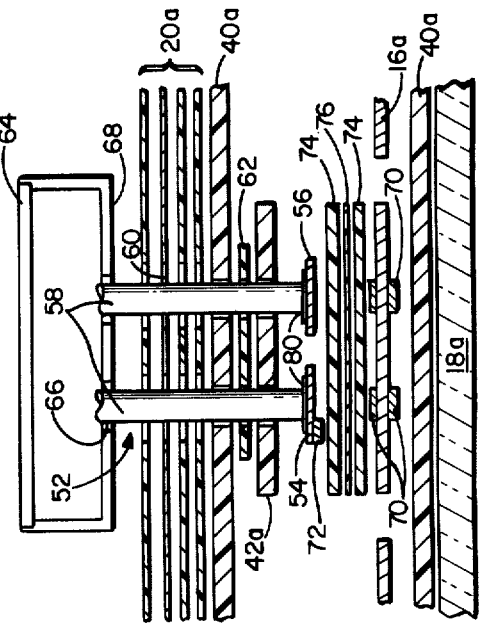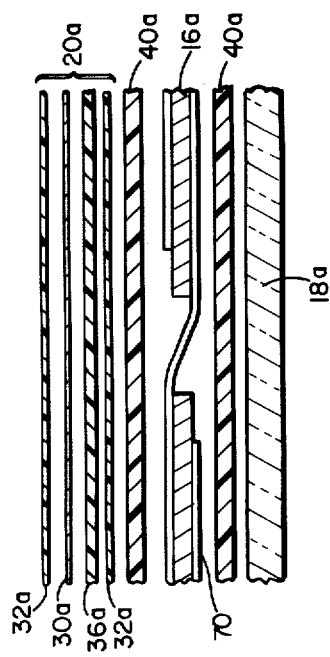

TERMINAL ASSEMBLY FOR SOLAR PANELS

BACKGROUND OF THE INVENTION

This invention relates generally to the solar panel art and, more particularly, to an insulated terminal assembly for providing external electrical connection to solar panels.

Solar panels having a plurality of solar cells have in the past been provided with an electrically conductive layer located behind the cell and a terminal assembly having a substantially flat conductive portion connected to the cell and located between the cell and the conductive layer. The electrical connection to the panel is made through terminal posts extending rearwardly from the flat portions and through enlarged openings in the conductive layer. One or more layers of a dielectric pottant material such as polyvinyl butyral provide insulation between the flat portion and the conductive layer. The conductive layer may also be laminated between two sheets of a weatherable dielectric material which are coextensive therewith. This construction has proved satisfactory for panels rated at about 50 volts; however, some panels of this type having higher voltage ratings exhibit low performance characteristics for reasons that have not been well understood. Applicants have discovered that the low performance of these panels in high voltage applications results from an electrical shorting between the edge of the hole cut in the conductive back layer and the flat portion of the terminal. While the provision of dielectric layers between the conductive layer and the flat portion is usually sufficient to prevent shorting at locations remote from the hole, the edge of the hole acts as a line-to-plane source of potential and thus substantially lowers the dielectric standoff through the intervening layers at that location. If a burr exists where the hole is cut in the conductive layer, the burr can act as a point-to-plane source and further lower the dielectric standoff. In high voltage panels, these points of lower standoff can permit arcing or shorting between the conductive back layer and the flat portion of the terminal.

The back layer is transformed from an effective plane source at locations remote from the hole therein to a line or point source at the edge of the hole. The magnitude of the resulting change in standoff provided by intervening dielectric layers can be appreciated by examining the standoff of air in similar situations. Thus, the dielectric standoff of air between two clean parallel plates is approximately 70 volts per mil, while the standoff of air between a point and a plane is on the order of 5 to 10 volts per mil.

A further problem encountered in prior solar panels having conductive back layers is a shorting between the conductive layers and the solar cells themselves. This problem is compounded when the cells are interconnected by a plurality of conductive ribbons which may be deformed at the cut ends thereof in a manner approximating a point source. The dielectric standoff provided by intervening layers is then greatly reduced, increasing the likelihood of a significant leakage current between the back layer and the terminal.

Therefore, in many applications it is desirable to provide a fully insulated terminal structure for effecting external electric connection to solar panels having conductive layers adjacent the backside thereof.

SUMMARY OF THE INVENTION

The present invention comprises a solar panel having at least one solar cell, an electrically conductive layer located behind the cell and defining an opening through the layer, and a terminal arrangement for establishing electrical connection to the solar cell. The terminal arrangement has a substantially flat conductive portion electrically connected to the cell and located between the cell and the conductive layer at a location at least partially overlapping the opening. A connector portion extends rearwardly from the flat portion through the opening. The solar panel further comprises an insulating member of high dielectric strength positioned behind the flat portion and extending about the connector portion to electrically isolate the flat portion from the conductive layer.

The insulating member preferably comprises a synthetic film in the form of a pad extending radially inwardly toward the connector portion to a location beyond the edge of the opening in the conductive layer. The connector portion is substantially smaller in diameter than the opening in the conductive layer. The synthetic film may be a polyester film approximately 0.003 inches (3 mils) thick, and preferably comprises polyethylene terephthalate. The film preferably has a dielectric standoff of at least 5000 volts and a resistivity of at least $10^{16}$ ohm-centimeters. The insulating member may further comprise a pair of adhesive film confining the synthetic film therebetween.

The solar panel may include a layer of high dielectric strength positioned between the cell and the conductive layer, the dielectric layer being substantially coextensive with the conductive layer. The dielectric layer is preferably positioned adjacent to the conductive layer and may comprise a polyester film such as polyethylene terephthalate.

The solar panel may include a plurality of solar cells and a plurality of terminal arrangements representing opposite polarities of the solar cells. The connector portion of the terminal arrangement may comprise a terminal post, and the terminal arrangement may include a corrosion-resistant sleeve structure received over the post.

The terminal arrangement of the present invention represents a significant advance over prior terminal arrangements. Solar panels incorporating the new terminal arrangement, and specifically the insulating films of high dielectric strength, exhibit improved performance due to the elimination of sources of short circuits within the panels. This is true because the 3 mil polyethylene terephthalate (PET) material used in the present invention has a high dielectric standoff and a very high resistivity. The dielectric standoff of electronic grade PET is between 5,000 and 6,000 volts per mil, while the resistivity is greater than $10^{16}$ ohm-centimeters.

When the terminal post or other connector portion of the present invention is substantially smaller in diameter than the opening in the conductive back layer, and the PET pad extends inwardly beyond the edge of the opening to a location near the terminal post, any shorting between the conductive layer and the terminal arrangement must pass through the pad. The distance between the edge of the back layer and the terminal post is great enough to eliminate shorting between those elements in the absence of moisture or contamination. The only part of the terminal arrangement which is close enough to the opening in the back layer to possibly permit shorting is the flat portion thereof. However, the high dielectric characteristics of the PET or other film prevent a short from occurring there.

The overall layer of PET or other strong dielectric material between the solar cells and the conductive layer operates in much the same way to eliminate shorting between those elements without significantly increasing the bulk or complexity of the arrangement.

The very high resistivity of electronic grade PET is due, in part, to its high purity. Any leakage current through the film is insignificant.

BRIEF DESCRIPTION OF THE DRAWINGS

The above and other objects of the present invention may be more fully understood from the following detailed description taken together with the accompanying drawings wherein similar characters refer to similar elements throughout and in which:

FIG. 6 is a bottom plan view, partially broken away, of another embodiment of the solar panel illustrated in FIG. 2;

FIG. 8 is a fragmentary vertical sectional view taken along the line 8—8 of FIG. 6; and FIG. 9 is a fragmentary vertical sectional view taken along the line 9—9 of FIG. 6.

DESCRIPTION OF THE PREFERRED EMBODIMENTS

Figure 1:
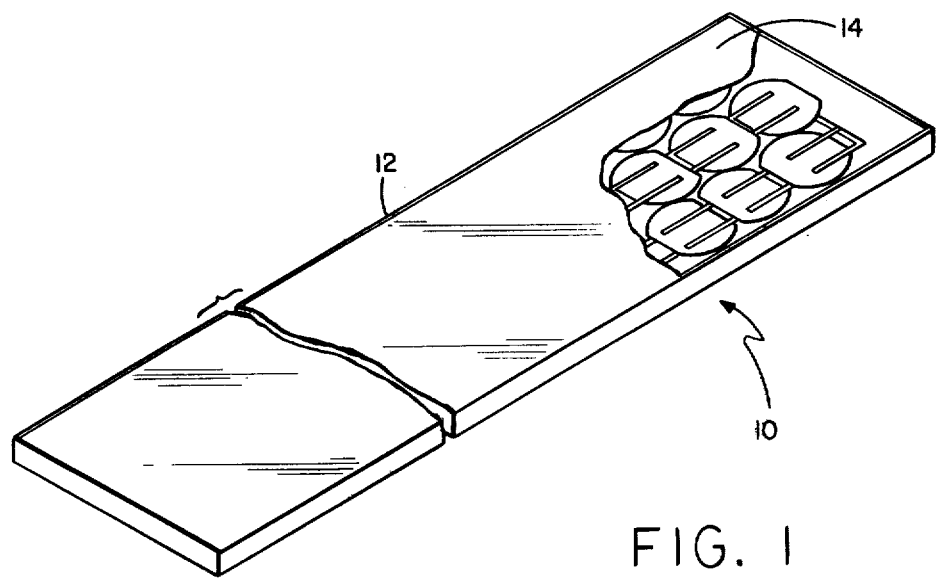
FIG. 1 is a perspective view of a solar panel constructed in accordance with the present invention.
Figure 3:
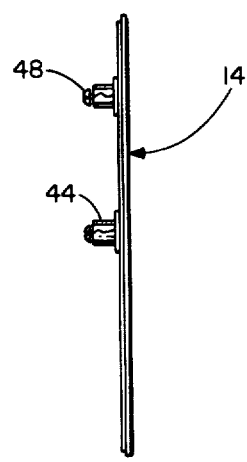
FIG. 3 is a side elevational view of the solar panel illustrated in FIG. 2.
Figure 7:
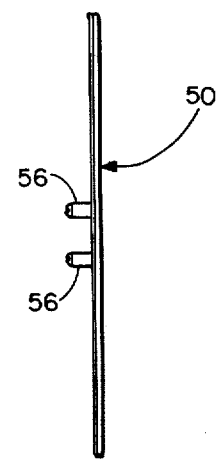
FIG. 7 is a side elevational view of the solar panel illustrated in FIG. 6.
Figure 2:
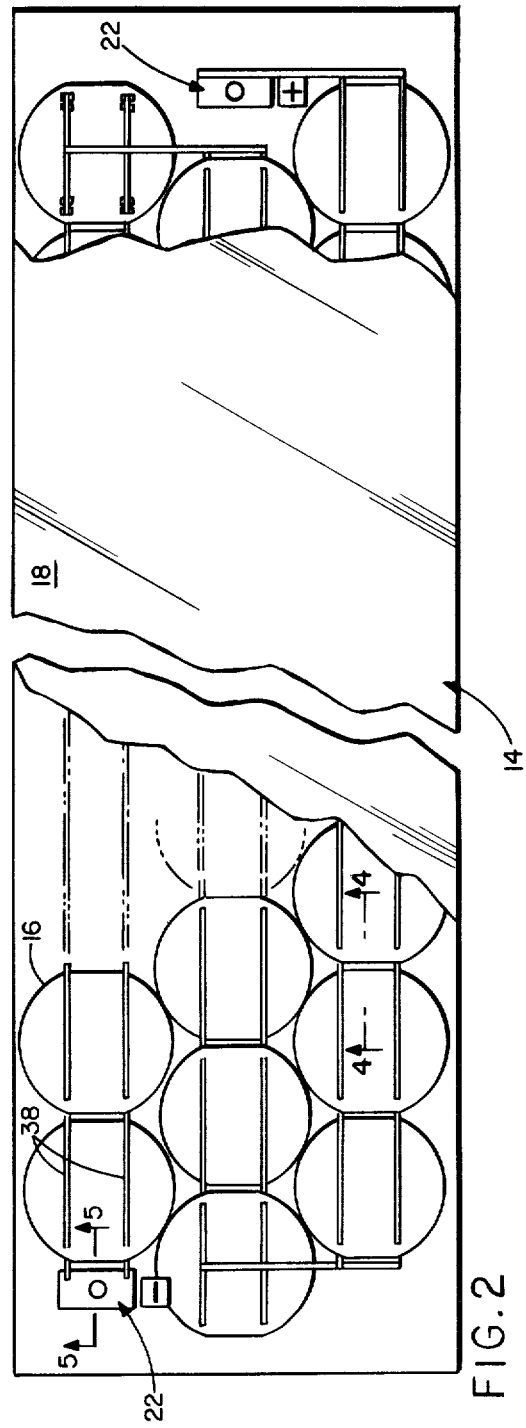
FIG. 2 is a bottom plan view, partially broken away, of the solar panel illustrated in FIG. 1 with a peripheral frame removed therefrom.
Figure 5:
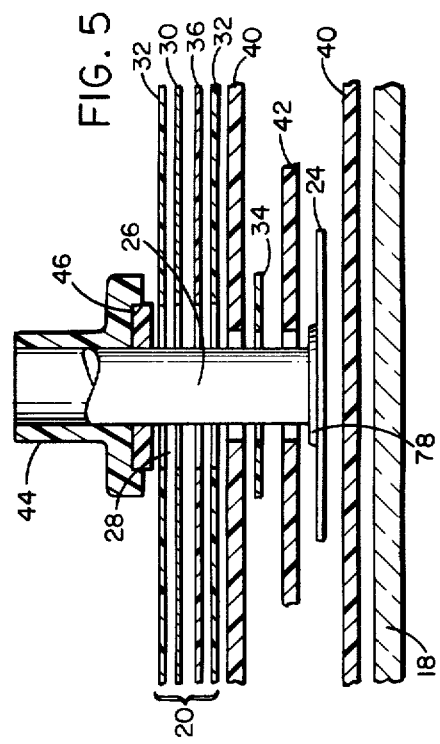
FIG. 5 is a fragmentary vertical sectional view taken along the line 5—5 of FIG. 2.
Figure 4:
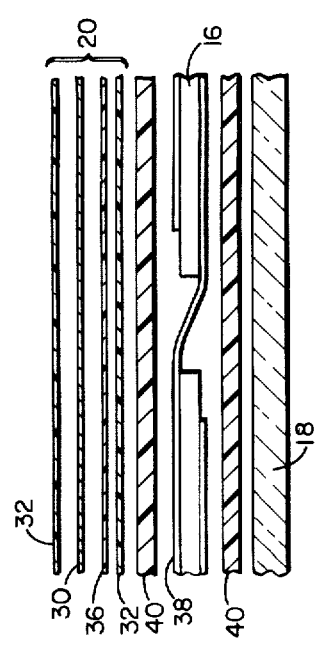
FIG. 4 is a fragmentary vertical sectional view taken along the line 4—4 of FIG. 2.

Referring now to the drawings, there is illustrated in FIGS. 1 through 5 a solar panel embodying the present invention, generally designated 10. The solar panel 10 comprises a peripheral frame 12 surrounding a laminated central panel 14. The central panel 14 includes an array of solar cells 16 positioned generally between a glass front layer 18 and a back layer 20.

A plurality of terminal arrangements 22 are provided for establishing external electrical connection to the solar cells 16. The terminal arrangements 22 are provided with a flat terminal plate portion 24 positioned between the front layer 18 and the back layer 20, and a terminal post or other connector portion 26 extending rearwardly from the flat portion 24 through an opening 28 in the back layer. The opening 28 in the back layer is substantially greater in diameter than the terminal post 26 to space the edge of the opening 28 from the terminal post. The opening 28 is preferably on the order of ⅜ of an inch in diameter while the terminal post is ⅛ of an inch in diameter. An insulating annulus of air 3/16 of an inch in width thus extends between the edge of the opening 28 and the terminal post, the annulus eventually being filled with a potting resin or other suitable material as discussed below.

The back layer 20 comprises a metallic foil layer 30 laminated between a pair of electrically insulating and weatherable layers 32. The opening 28 in the back layer 20 exposes an edge of the foil layer 30 which at best represents a line source of potential relative to the flat terminal portion 24. If the opening 28 is not cleanly formed in the back layer 20, any burrs or irregularities at the edge of the foil layer can act as a point source of potential relative to the flat portion 24. An insulating pad 34 of high dielectric strength is positioned between the edge of the foil layer 30 and the flat terminal portion 24 to electrically isolate those elements from each other. The pad 34 may be rectangular in shape and extends inwardly toward the terminal post to a location radially inside of the foil edge.

A layer 36 of similarly high dielectric strength may be provided within the back layer 20 between the foil layer 30 and the inner weatherable layer 32. The layer 36 thus enhances the electrical isolation of the foil layer 30 from the remainder of the solar panel 10, improving the high voltage characteristics of the panel. The layer 36 is particularly useful for increasing the dielectric standoff between portions of the solar cells 16 and the foil layer 30. The solar cells are commonly connected by a plurality of conductive ribbons 38 which can have burrs or other irregularities at cut ends thereof, approximating point sources of voltage relative to the foil layer. Without a layer of high dielectric strength such as the layer 32, a breakdown or excess current leakage might occur between the ribbons and the layer 30.

The pad 34 and the layer 36 may comprise a layer of polyester or other suitable high dielectric material, preferably polyethylene terephthalate (PET). This material is available commercially as a highly pure electronic grade film having a dielectric standoff of approximately 5,000 to 6,000 volts per mil and a resistivity of greater than $10^{16}$ ohm-centimeters. A PET film at least 3 mils thick has been found to be suitable for these purposes in panels rated at 250 volts.

The array of solar cells 16 is preferably encapsulated between a pair of transparent dielectric pottant layers 40. Similarly, one or more pads 42 of pottant material may be provided adjacent the insulating pad 34 between the flat terminal portion 24 and the foil layer 30. The pad 42 thus provides additional dielectric standoff and aids in sealing the solar panel 10 in the area of the terminal arrangements 22. The pottant layers 40 and the pad 42 are preferably approximately 15 mils thick, and may be made of any suitable transparent material, such as polyvinyl butyral (PVB) or ethylene vinyl acetate (EVA). PVB is a transparent thermoplastic pottant material which has been used in a number of prior solar panels. EVA is a thermosetting material which has also been used as an encapsulant. A particular formulation of EVA which has been found to be particularly attractive is the following: (1) 100 parts of Dupont's Elvax-150 ethylene vinyl acetate formulation; (2) 0.1 part of Ciba-Geigy's Tinuvin 770 and 0.3 part of American Cyanamid's Cyasorb UV-531 ultraviolet radiation absorbers; (3) 0.2 part of Uniroyal's Naugard anti-oxidant; and (4) 0.5 part of Penwalt's Lupersol 101 peroxide cross-linking agent. Also, the addition to the formulation of an organosilane primer, for example, 0.25 to 1.0 part of a mixture of 10% of Union Carbide's A1100 and 90% of Union Carbide's A174, or A174 alone, should improve the formulation's sticking characteristics during the panel formation process.

Lamination of the insulating pad 34 and the layer 36 in position relative to the adjoining elements of the solar panel may be accomplished by applying a suitable adhesive (not shown) to the opposite sides thereof. The adhesive chosen will depend upon whether the pottant layers are formed of PVB or EVA, and should be humidity resistant to counteract the natural tendency of polyester to attract water to its surface. When PVB is used as the encapsulant, a nitrile phenolic resin can be used in dry sheet form. Sheets of this type are available from Bostik as number 10-250-2. These adhesive sheets are 2 mils thick and can be prelaminated to the PET elements 34 and 36 prior to overall lamination of the panel 10. Alternately, a solvent applied adhesive, such as Dupont's Polyester Adhesive number 49000, may be coated on both sides of the PET elements and dried. The overall lamination process thus bonds the polyester elements in place and yields a fully sealed and humidity resistant panel. If EVA is used as the encapsulant, a different adhesive, e.g. polyethylene, can be used.

The terminal post 26 is preferably surrounded by an annular sleeve structure 44 made of plastic or other corrosion resistant material. The sleeve structure 44 is held in position about the terminal post by a conventional potting resin 46 applied around the base of the post in the area of the opening 28. The resin may be an epoxy or silicone potting resin and serves to seal the area of the opening 28 against the intrusion of moisture or other contaminants which might lower the dielectric standoff in that area. The upper end of the terminal post 26 extends slightly beyond the sleeve 44 and is adapted to threadingly receive a screw 48 (FIG. 3) for connecting an external electrical lead (not shown) thereto.

The insulating and weatherable layers 32 of the back layer 20 may comprise a suitable oriented film of polyvinyl fluoride resin, such as that manufactured by Dupont under the name Tedlar.

In contrast to the high dielectric properties of the pad 34 and the layer 36, the PVB and EVA pottant materials described above typically have dielectric standoffs of approximately 350 and 700 volts per mil, respectively, and resistivities on the order of $10^{11}$ and $10^{14}$ ohm-centimeters, respectively. The Tedlar material of the insulating and weatherable layers 32 has a dielectric standoff of 3000 volts per mil and a resistivity of between $10^{13}$ and $10^{14}$ ohm-centimeters. These materials are thus much more likely to permit shorting in high voltage panels than the high dielectric materials of the elements 34 and 36, and would permit undesirably high leakage currents in the panels. This is particularly true when PVB and Tedlar are used together, since the plasticizer in solar grade PVB softens and weakens the electrical properties of the Tedlar.

Referring now to FIGS. 6 through 9, there is illustrated another embodiment of a solar panel constructed in accordance with the present invention, generally designated 50. The laminated panel 50 corresponds generally with the panel 14 illustrated in FIG. 2, and can be substituted therefor in the solar panel 10 of FIG. 1. The components of the central panel 50 which are the same or similar to components of the panel 14 are referred to in FIGS. 6 through 9 by similar numbers, with the suffix "a" added thereto. Thus, the central panel 50 comprises an array of solar cells 16a positioned between a glass front layer 18a and a back layer 20a. The back layer 20a comprises a metallic foil layer 30a laminated between a pair of insulating and weatherable layers 32a. A layer of high dielectric strength 36a is provided between the foil layer 30a and the inner weatherable layer 32a. The solar cells 16a are also encapsulated between a pair of dielectric pottant layers 40a in the manner of the solar cells 16.

In place of the plurality of terminal arrangements 22 described with respect to the central panel 14, the panel 50 is provided with a terminal arrangement 52 comprising a pair of discrete terminal plate portions 54 and 56. The terminal plate portions 54 and 56 each have a pair of terminal posts 58 extending through corresponding openings 60 of the back layer 20a. The terminal posts 58 are substantially smaller in diameter than the openings 60 in the manner of the terminal posts 26 described above, and an insulating pad 62 of high dielectric strength is positioned behind the terminal plate portions 54 and 56 in the manner of the insulating pad 34. Thus, the insulating pad 62 acts as a barrier between the exposed edges of the openings 60 and the two terminal plate portions, greatly increasing the dielectric standoff between those locations and eliminating the possibility of shorting therebetween.

In place of the annular sleeves 44 surrounding the terminal posts 26 of the central panel 14, the terminal posts 58 of the panel 50 are covered with a junction box 64 which receives the posts 58 within openings 66 therein to protect the terminal posts and any attached conductors (not shown) from the atmosphere. The underside 68 of the junction box is preferably sealed against the central panel 50 by a suitable potting resin (not shown) similar to the potting resin 46 of the panel 14. The potting resin prevents the intrusion of moisture or other contaminants into the area of the terminal posts 58.

The principal difference between the panel 50 and the panel 14 is the location and number of terminal posts. In the panel 14, the terminal posts 26 are located at opposite ends thereof and do not overlie the solar cells 16. In the panel 50, however, the terminal posts 58 are positioned together to enable all of the connections to be made at one location within a junction box. The terminal arrangement 52 which includes the posts 58 occupies a larger contiguous area on the panel than do the terminal arrangements 22, causing the terminal arrangement 52 to underlie one of the solar cells 16a. The terminal plate portions 54 and 56 are then connected into the circuit of the array of solar cells 16a by a plurality of conductive ribbons 70 which are basically similar to the ribbons 38 of the panel 14. However, because the cells 16a are arranged in an odd number of rows and connected in series, an elongated interconnect portion 72 of the ribbons 70 is required to locate all of the connections in one junction box. The portion 72 extends under the middle row of solar cells 16a to connect the terminal plate portion 54 to a remote end 73 of the solar cell circuit.

In order to electrically isolate the ribbon portion 72 from the different potentials of the various solar cells, a pair of strips 74 of dielectric pottant material and a strip 76 of high dielectric strength material may be positioned between the portion 72 and the central row of the solar cells 16a. While it is not required that both the strips 74 and 76 be provided to isolate the portion 72 from the solar cells, it is desirable that one or the other be included. The strips 74 are made of the same material as the pottant layers 40a and the pottant pad 42a positioned adjacent the insulating pad 62. The strip 76 is preferably of the same high dielectric strength material as the layer 36a and the pad 62.

It will be understood that the metallic foil layers 30 and 30a of the central panels 14 and 50 are preferably grounded in use with the peripheral frame 12 of FIG. 1. Grounding of the foil fixes its electrical potential at zero, eliminating the possibility of unsafe or erratic operation resulting from a floating potential on the foil. The grounding of the foil to the frame can be accomplished with a wire or other suitable conductor (not shown) which may be soldered or welded to the foil and to the frame, or by leaving tabs or ears (not shown) at the edges of the foil composite for penetration by frame mounting screws or other fasteners.

The central panels 14 and 50 are both manufactured by a suitable lamination process with the glass layers 10 and 18 and 18a at the bottom. Thus, a glass layer is first positioned on a work surface, followed by one of the pottant layers 40 or 40a and the array of solar cells 16 or 16a. In the case of the central panel 14, the two flat terminal plate portions 24 are positioned at the appropriate locations on the pottant layer 40 at opposite ends of the panel. The pottant pad 42, the insulating pad 34, the second pottant layer 40 and the back layer 20 are then added in that order, before the panel is subjected to heat and pressure sufficient to cause the pottant layers 20 to fill the voids in the panel and to cause the adhesives on either side of the insulating pad 34 to take hold. Solder discs 78 and the terminal posts 26 are then passed through the openings in the various layers of the laminate to abut the flat terminal portions 24, and the posts 26 are induction soldered in place. A potting resin is finally smeared about the base of the terminal posts and the sleeves 44 are forced thereover to fully seal the panel 14 from the atmosphere.

The layers 34 and 32 are preferably prelaminated to the foil layer 30 to form the back layer 20, permitting the back layer to be handled as a single element during the final laminating process. The openings 28 in the back layer 20 are preferably formed after prelamination to produce accurately aligned holes in the layers thereof.

The laminating process is essentially the same in the case of the panel 50 except for the addition of the strips 74 and 76 and the fact that the terminal plate portions 54 and 56 are positioned over one of the cells 16a for lamination. The openings in the various layers are registered in the manner of the central panel 14 to permit the terminal posts 58 to be induction soldered thereto with a plurality of solder discs 80. After the lamination and soldering operations are complete, a potting resin is placed about the bases of the terminal posts and the junction box 64 is positioned thereover. The openings 66 and the underside 68 of the junction box are thus bonded securely to the panel 50.

It will be understood that the layers 36 and 36a and the strip 76 of high dielectric material described above are optional in the practice of the present invention. While they are highly advantageous where complete electrical isolation of the corresponding elements is desired, they are not required in some cases.

In operation, the laminated central panels 14 and 50 are each placed within a peripheral frame 12 of the type shown in FIG. 1. The frame 12 may be formed of extruded aluminum or other suitable material receiving the appropriate central panel within an interior groove thereof. Once assembled, the solar panels of the present invention comprise fully sealed and self-sustaining units for the direct conversion of solar energy of electrical energy. They are highly weatherable and reliable due to the degree of electrical isolation therein, and are thus ideal for long-term maintenance-free use.

From the above, it can be seen that there has been provided an improved structure permitting solar panels having conductive back layers to operate at high voltages without loss of performance due to internal shorting or excess current leakage. Panels of this structure with ratings as high as 250 volts have been operated without loss of efficiency.

What is claimed is:

1. A solar panel comprising:
   at least one solar cell;
   an electrically conductive layer located behind the cell and defining an opening through the layer;
   a terminal arrangement for establishing external electrical connection to the solar cell, including a substantially flat conductive portion electrically connected to the cell and located between the cell and the conductive layer at a location at least partially overlapping said opening, and a connector portion extending rearwardly from the flat portion through the opening; and
   an insulating member of high dielectric strength positioned behind the flat portion and extending about the connector portion to electrically isolate the flat portion from the conductive layer.

2. The solar panel recited in claim 1 wherein the conductive layer comprises an edge portion defining said opening and the insulating member comprises a synthetic polymeric film extending radially inwardly toward the connector portion to a location beyond the edge portion.

3. The solar panel recited in claim 2 wherein the film comprises a pad having a peripheral edge substantially coextensive with the flat portion.

4. The solar panel recited in claim 3 wherein the connector portion is substantially smaller in diameter than the opening in the conductive layer.

5. The solar panel recited in claim 2 wherein the synthetic polymeric film has a dielectric standoff of at least 5000 volts per mil.

6. The solar panel recited in claim 5 wherein the synthetic polymeric film has a resistivity of at least $10^{16}$ ohm-centimeters.

7. The solar panel recited in claim 2 wherein the synthetic polymeric film is polyester.

8. The solar panel recited in claim 7 wherein the synthetic polymeric film comprises polyethylene terephthalate.

9. The solar panel recited in claim 8 wherein the film is approximately 0.003 inches thick.

10. The solar panel recited in claim 8 wherein the insulating member further comprises a pair of adhesive layers confining the synthetic film therebetween.

11. The solar panel recited in claim 10 wherein the adhesive layers comprise a nitrile phenolic adhesive.

12. The solar panel recited in claim 10 wherein the adhesive layers comprise a polyester adhesive.

13. The solar panel recited in claim 1 which comprises a layer of high dielectric strength positioned between the cell and the conductive layer, said dielectric layer being substantially coextensive with the conductive layer.

14. The solar panel recited in claim 13 wherein the dielectric layer is located adjacent to the conductive layer.

15. The solar panel recited in claim 14 wherein the dielectric layer comprises a synthetic polymeric film having a dielectric standoff of at least 5000 volts per mil.

16. The solar panel recited in claim 15 wherein the synthetic polymeric film has a resistivity of at least $10^{16}$ ohm-centimeters.

17. The solar panel recited in claim 14 wherein the dielectric layer comprises a polyester film.

18. The solar panel recited in claim 17 wherein the polyester film comprises polyethylene terephthalate.

19. The solar panel recited in claim 17 wherein the dielectric layer further comprises a pair of adhesive layers confining the polyester film therebetween.

20. The solar panel recited in claim 1 which further comprises:
 a plurality of said solar cells;
 at least one conductive strip interconnecting the solar cells, a portion of the conductive strip underlying at least one of the cells; and
 a further insulating member of high dielectric strength positioned between said portion of the conductive strip and said at least one of the cells to electrically isolate said portion therefrom.

21. The solar panel recited in claim 20 wherein the insulating members comprise synthetic polymeric films having dielectric standoffs of at least 5000 volts per mil.

22. The solar panel recited in claim 21 wherein the synthetic polymeric films have resistivities of at least $10^{16}$ ohm-centimeters.

23. The solar panel recited in claim 20 wherein the insulating members of high dielectric strength comprise polyester films.

24. The solar panel recited in claim 23 wherein the polyester films comprise polyethylene terephthalate.

25. The solar panel recited in claim 1 wherein the electrically conductive layer comprises a foil layer having a weatherable covering.

26. The solar panel recited in claim 1 which includes a plurality of said terminal arrangements representing opposite polarities of the solar cell.

27. The solar panel recited in claim 1 wherein the connector portion of the terminal arrangement comprises a terminal post, and the terminal arrangement further comprises a corrosion-resistant sleeve structure received over the post.

* * * * *